US009165643B2

(12) United States Patent
Ichige

(10) Patent No.: US 9,165,643 B2
(45) Date of Patent: Oct. 20, 2015

(54) NONVOLATILE SEMICONDUCTOR MEMORY DEVICE

(71) Applicant: KABUSHIKI KAISHA TOSHIBA, Minato-ku (JP)

(72) Inventor: Masayuki Ichige, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/562,904

(22) Filed: Dec. 8, 2014

(65) Prior Publication Data

US 2015/0092468 A1  Apr. 2, 2015

Related U.S. Application Data

(63) Continuation of application No. 13/771,466, filed on Feb. 20, 2013, now Pat. No. 8,908,410.

(30) Foreign Application Priority Data

Aug. 24, 2012  (JP) ................................. 2012-185368

(51) Int. Cl.
*G11C 5/00* (2006.01)
*G11C 13/00* (2006.01)
*G11C 5/02* (2006.01)
*G11C 7/18* (2006.01)
*G11C 8/12* (2006.01)

(52) U.S. Cl.
CPC ............ *G11C 13/0002* (2013.01); *G11C 5/025* (2013.01); *G11C 7/18* (2013.01); *G11C 8/12* (2013.01)

(58) Field of Classification Search
CPC ..... G11C 5/025; G11C 5/063; G11C 2213/72; G11C 13/002; G11C 13/004
USPC ............. 365/51, 63, 100, 105, 113, 115, 148, 365/175
See application file for complete search history.

(56) References Cited

U.S. PATENT DOCUMENTS

| 7,742,332 B2 | 6/2010 | Nakai |
| 7,911,824 B2 | 3/2011 | Kawai et al. |
| 7,920,408 B2 | 4/2011 | Azuma et al. |
| 7,957,203 B2 * | 6/2011 | Nagashima et al. ...... 365/189.04 |

(Continued)

FOREIGN PATENT DOCUMENTS

| JP | 2009-71298 | 4/2009 |
| JP | 2009-199713 | 9/2009 |

(Continued)

OTHER PUBLICATIONS

Office Action issued Mar. 25, 2015 in Taiwanese Patent Application No. 102105761 (with English language translation).

*Primary Examiner* — Gene Auduong
(74) *Attorney, Agent, or Firm* — Oblon, McClelland, Maier & Neustadt, L.L.P.

(57) ABSTRACT

This nonvolatile semiconductor memory device comprises a memory cell array configured having a plurality of memory mats arranged therein, each of the memory mats having a memory cell disposed therein at an intersection of a first line and a second line, the memory cell including a first variable resistance element. A third line extends through a plurality of the memory mats. A second variable resistance element is connected between the third line and the second line of each of the plurality of memory mats.

18 Claims, 8 Drawing Sheets

(56) References Cited

U.S. PATENT DOCUMENTS

| | | |
|---|---|---|
| 8,036,010 B2 | 10/2011 | Maejima |
| 8,085,577 B2 | 12/2011 | Kanno et al. |
| 8,149,606 B2 | 4/2012 | Maejima |
| 8,223,536 B2 | 7/2012 | Tonomura et al. |
| 8,274,815 B2 | 9/2012 | Ichihara et al. |
| 8,467,229 B2 | 6/2013 | Ikeda et al. |
| 8,553,445 B2 | 10/2013 | Baek et al. |
| 8,565,003 B2 | 10/2013 | Siau |
| 8,675,393 B2 | 3/2014 | Katayama et al. |
| 8,908,410 B2 * | 12/2014 | Ichige .................. 365/51 |
| 2011/0007548 A1 | 1/2011 | Jung et al. |
| 2011/0242875 A1 * | 10/2011 | Nagashima et al. ...... 365/148 |
| 2011/0317472 A1 | 12/2011 | Awaya et al. |
| 2012/0063194 A1 | 3/2012 | Baek et al. |

FOREIGN PATENT DOCUMENTS

| | | |
|---|---|---|
| JP | 2009-223971 | 10/2009 |
| JP | 2011-65713 | 3/2011 |
| JP | 2012-15211 | 1/2012 |

* cited by examiner

NONVOLATILE SEMICONDUCTOR MEMORY DEVICE

CROSS REFERENCE TO RELATED APPLICATIONS

This application is a continuation of and is based upon and claims the benefit of priority under 35 U.S.C. §120 from U.S. Ser. No. 13/771,466, filed Feb. 20, 2013, and claims the benefit of priority under 35 U.S.C. §119 from Japanese Patent Application No. 2012-185368, filed Aug. 24, 2012. The entire contents of which are incorporated herein by reference.

FIELD

Embodiments described in the present specification relate to a nonvolatile semiconductor memory device.

BACKGROUND

In recent years, memory employing a resistance varying element has been receiving attention as a candidate for file memory acting as a large capacity data storage medium. As an example of general configuration for aiming large capacity storage employing such a resistance varying memory, there is proposed a method that adopts a cross-point type cell structure where a memory cell is formed at a crossing point of an intersecting bit line and word line.

This cross-point type configuration is characterized in that its configurative elements are generally simple. Moreover, in this cross-point type configuration, miniaturization is easy compared to in a conventional memory cell, storage density of a cell array having memory cells disposed in an array can be increased, and, furthermore, adopting a stacking structure in a longitudinal direction enables memory capacity density to be significantly increased. As a result, this cross-point type configuration has a merit that a degree of integration of a memory cell array can be easily improved.

In such a cross-point type resistance varying memory, in order to achieve a larger capacity, the memory cell array must be made larger. In such a case, it faces some problems such as deterioration in defect rescue efficiency, deterioration in defect rescue replacement, deterioration in operating margin in an memory cell array, and deterioration in operating performance margin due to voltage drop or the like. As a result, there are many problems in achieving a larger capacity simply by a single array configuration.

Accordingly, it has been proposed to divide the memory cell array into a plurality of memory arrays to alleviate these adverse effects. A smallest unit of this divided array is here assumed to be called "a memory mat." When plural memory mats are present in the memory cell array in this manner, wiring lines linking between the memory mats and a control system circuit for controlling these wiring lines become necessary. At this time, it becomes required to switch connection between local wiring lines in each of the memory mats and global wiring lines distributed through a plurality of the memory mats. There is a problem that circuit area corresponding to a circuit for this kind of switching and to its control circuit increases, leading to an increase in chip area that leads in turn to a reduction in chip yield on the wafer.

DETAILED DESCRIPTION

A nonvolatile semiconductor memory device according to an embodiment described below comprises a memory cell array configured having a plurality of memory mats arranged therein, each of the memory mats having a memory cell disposed therein at an intersection of a first line and a second line, the memory cell including a first variable resistance element. A third line extends through a plurality of the memory mats. A second variable resistance element is connected between the third line and the second line of each of the plurality of memory mats.

The nonvolatile semiconductor memory device according to an embodiment of the present invention is described in detail below with reference to the drawings.

First Embodiment

[Overall Configuration]

Figure 1:
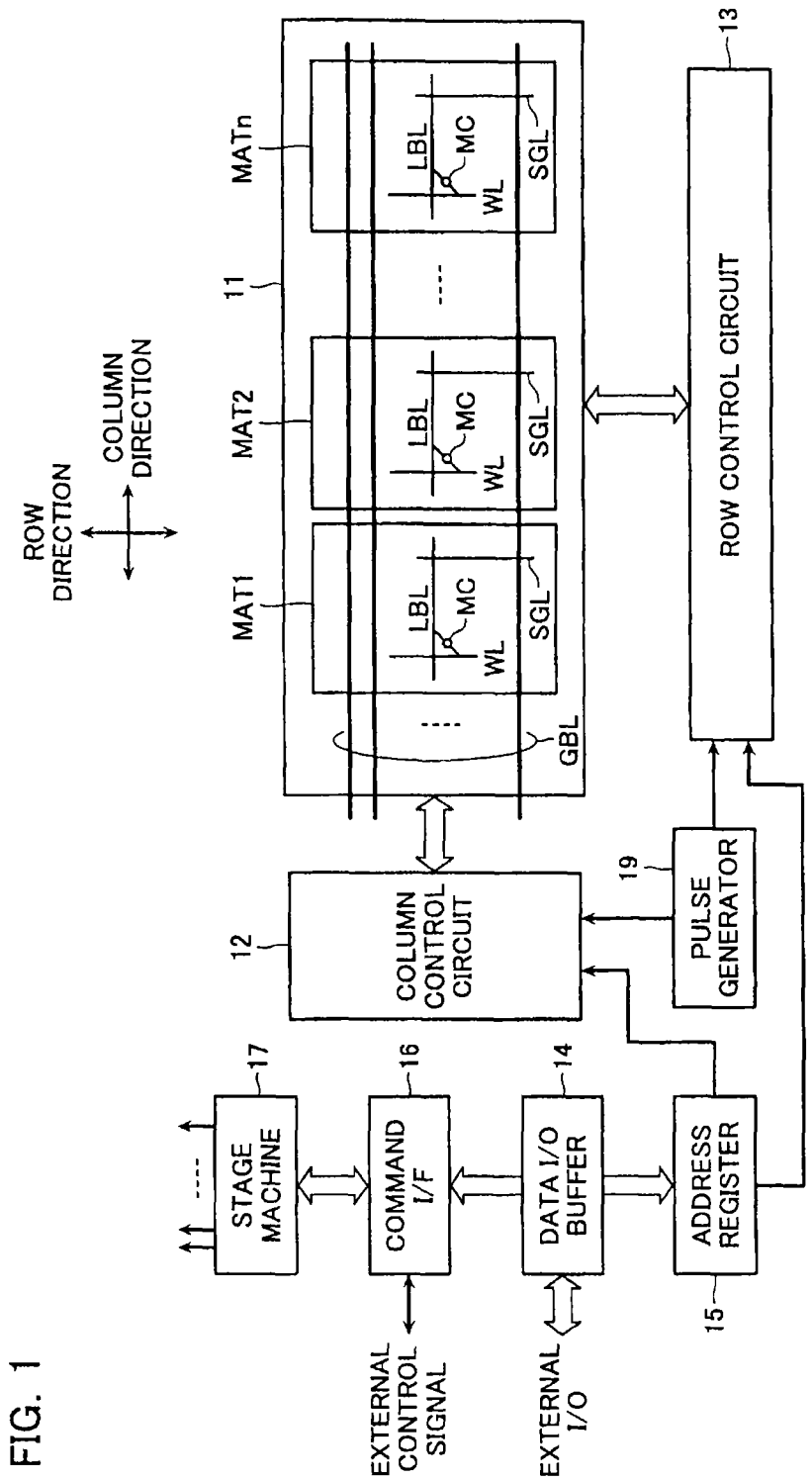
FIG. 1 is a block diagram showing an overall configuration of a nonvolatile semiconductor memory device according to a first embodiment.

FIG. 1 is a block diagram of a nonvolatile memory according to a first embodiment.

This nonvolatile memory comprises a memory cell array 11. The memory cell array 11 is configured from a plurality of memory mats MAT1~MATn.

A single memory mat MATi is configured having a plurality of memory cells MC arranged in a matrix therein. The memory cells MC are disposed at intersections of a plurality of local bit lines LBL and a plurality of word lines WL. Note that each of the memory mats MAT also comprises a select gate line SGL orthogonal to the local bit lines LBL and extending in parallel to the word lines WL.

In addition, global bit lines GBL are arranged through these plurality of memory mats MAT1~MATn. A relationship of connection between the global bit lines GBL and the local bit lines LBL is described later.

A column control circuit 12 is connected to the global bit line GBL. The column control circuit 12 controls a potential of the global bit line GBL to perform data erase of the memory cells MC, data write to the memory cells MC, and data read from the memory cells MC. Moreover, a row control circuit 13 is connected to the word line WL. The row control circuit 13 functions to control a potential of the word line WL and the select gate line SGL. These column control circuit 12 and row control circuit 13 configure a data read/write circuit for performing read/write of data to the memory cell array 11.

A data input/output buffer 14 is connected to an external host device not illustrated to receive write data from the host device, receive an erase command from the host device, output read data to the host device, and receive address data or command data from the host device. The data input/output buffer 14 sends write data received from the host device to the column control circuit 12 and receives data read from the column control circuit 12 to be outputted to external.

An address supplied to the data input/output buffer 14 from the external host device is sent to the column control circuit 12 and the row control circuit 13 via an address register 15. Moreover, a command supplied to the data input/output buffer 14 from the external host device is sent to a command interface 16. The command interface 16 receives an external control signal from external, judges whether data inputted to the data input/output buffer 14 is write data or a command or an address, and, if a command, receives the data and transfers the data to a state machine 17 as a command signal.

The state machine 17 performs management of this nonvolatile memory overall, and receives a command from the external host device to perform, management of read, write, erase, input/output of data, and so on. In addition, it is also possible for status information managed by the state machine 17 to be received by the external host device, whereby an operation result can be judged by the external host device. Moreover, this status information is used also in control of write and erase.

In addition, the state machine 17 controls a pulse generator 19. This control enables the pulse generator 19 to output a pulse of any voltage and any timing. Now, the pulse formed may be transferred to any line selected by the column control circuit 12 and the row control circuit 13. Note that peripheral circuit elements other than the memory cell array 11 may be formed in a silicon (Si) substrate directly below the memory cell array 11 formed in a wiring layer, whereby chip area of this nonvolatile memory may be configured substantially equal to area of the memory cell array 11.

[Memory Cell Array and its Peripheral Circuits]

Figure 2:
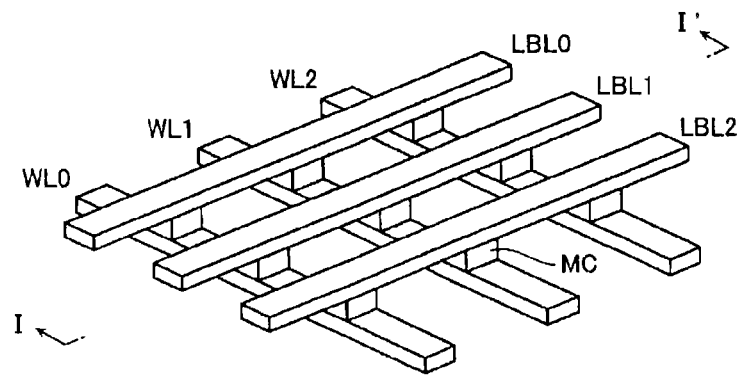
FIG. 2 is a perspective view showing a configuration of part of a memory cell array 11.
Figure 3:
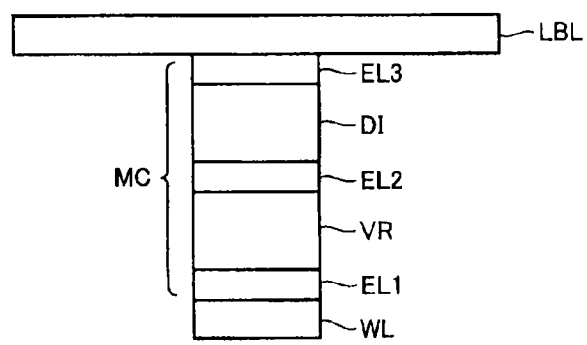
FIG. 3 is a cross-sectional view showing a configuration of a memory cell MC.

FIG. 2 is a perspective view of part of the memory cell array 11, and FIG. 3 is a cross-sectional view taken along the line I-I' as seen from the direction of the arrows in FIG. 2, showing a single memory cell portion.

A plurality of word lines WL are arranged in parallel to each other having a row direction as a long direction, and a plurality of local bit lines LBL are arranged in parallel with each other having a column direction as a long direction so as to intersect these word lines WL. Moreover, memory cells MC are disposed at intersections of the two lines. A material of the word lines WL and the local bit lines LBL is preferably heat-resistant and having a low resistance value. For example, the following may be employed as the material of the word lines WL and the local bit lines LBL, namely, W (tungsten), Mo (molybdenum), WSi (tungsten silicide), NiSi (nickel silicide), CoSi (cobalt silicide), or Cu (copper), Al (aluminum), alloys of these, or a carbon system material, and so on.

As shown in FIG. 3, the memory cell MC is configured from a series connected circuit of a variable resistance element VR (first variable resistance element) and a diode DI. The variable resistance element VR is configured from a material capable of having its resistance value changed by a voltage application. Formed on a lower surface and an upper surface of the variable resistance element VR are electrodes EL1 and EL2 that function as a barrier metal and an adhesive layer. Moreover, formed also between the local bit line LBL and the diode DI is a similar electrode EL3.

Employed as a material of the electrodes EL1, EL2, and EL3 is semiconductor, metal, metal compound, or the like. Examples of the semiconductor employed here include polycrystalline silicon, amorphous silicon, silicon germanium (SiGe) and germanium (Ge) that are doped with phosphorus (P), arsenic (As), boron (B) or the like. Examples of the metal and metal compound employed here include platinum (Pt), gold (Au), silver (Ag), copper (Cu), titanium aluminum nitride (TiAlN), SrRuO, ruthenium (Ru), ruthenium nitride (RuN), iridium (Ir), cobalt (Co), titanium (Ti), titaniumnitride (TiN), tantalum nitride (TaN), LaNiO, aluminum (Al), PtIrOx, PtRhOx, Rh/TaAlN and so on, and combinations of these metals and metal compounds. In addition, a metal film to make orientation uniform may also be inserted between the electrodes EL1 and EL2 and the variable resistance element VR. Moreover, a separate buffer layer, barrier metal layer, adhesive layer, and so on, may also be inserted.

Employable as the variable resistance element VR are: an element having its resistance value changed by a phase shift between a crystalline state and an amorphous state such as chalcogenide (PCRAM); an element that changes its resistance value by depositing metal cations in its base material to form a cross-link (conducting bridge: CB) between electrodes and ionizes the deposited metal to destroy the cross-link (CBRAM: Conductive Bridge RAM); an element that changes its resistance value by application of a voltage or current (ReRAM); and so on.

Examples of a base material in CBRAM include silicon (Si), a polycrystalline silicon film, an amorphous silicon film, a silicon oxide film (SiOx), a silicon nitride film (SiN), a silicon oxynitride film (SiON), carbon (C), a metal oxide film (for example, alumina AlOx, hafnia HfOx, and so on), germanium (Ge), silicon germanium (SiGe), sulfur (S), a sulfide, tellurium (Te), silver oxide ($Ag_2O$), silver sulfide ($Ag_2S$), silver selenide ($Ag_2Se$), silver telluride ($Ag_2Te$), silver iodide (AgI), copper iodide ($CuI_2$), copper oxide (CuO), copper sulfide (CuS), copper selenide (CuSe), copper telluride (CuTe), germanium oxide ($GeO_2$), and other semiconductors or insulating films, and so on. Moreover, the variable resistance element VR may have a structure where a plurality of layers combining these materials are stacked. Note that these materials may be employed without being limited to the specific composition ratios described here.

Examples of metal cations in CBRAM include cations of metal materials of the likes of gold (Au), silver (Ag), copper (Cu), aluminum (Al), platinum (Pt), nickel (Ni), cobalt (Co), titanium (Ti), and so on.

Examples of a base material in ReRAM include the likes of a metal oxide film (for example, alumina AlOx, hafnia HfOx, and so on).

Moreover, in the configuration of FIG. 3, there is a stacked structure of the variable resistance element VR and the diode DI. However, in a memory element where a diode function is built into the variable resistance element VR, the diode DI is not necessarily required. That is, the memory cell MC may also adopt a configuration of word line WL~electrode EL1~variable resistance element VR~electrode EL2~local bit line LBL. Moreover, the same applies in the case where a film having a current-limiting function is built into the memory cell MC.

Next, a specific configuration of the memory mats MAT1~MATn and a relationship of connection of the memory mats MAT1~MATn and the global bit lines GBL is described with reference to FIG. 4.

Figure 4:
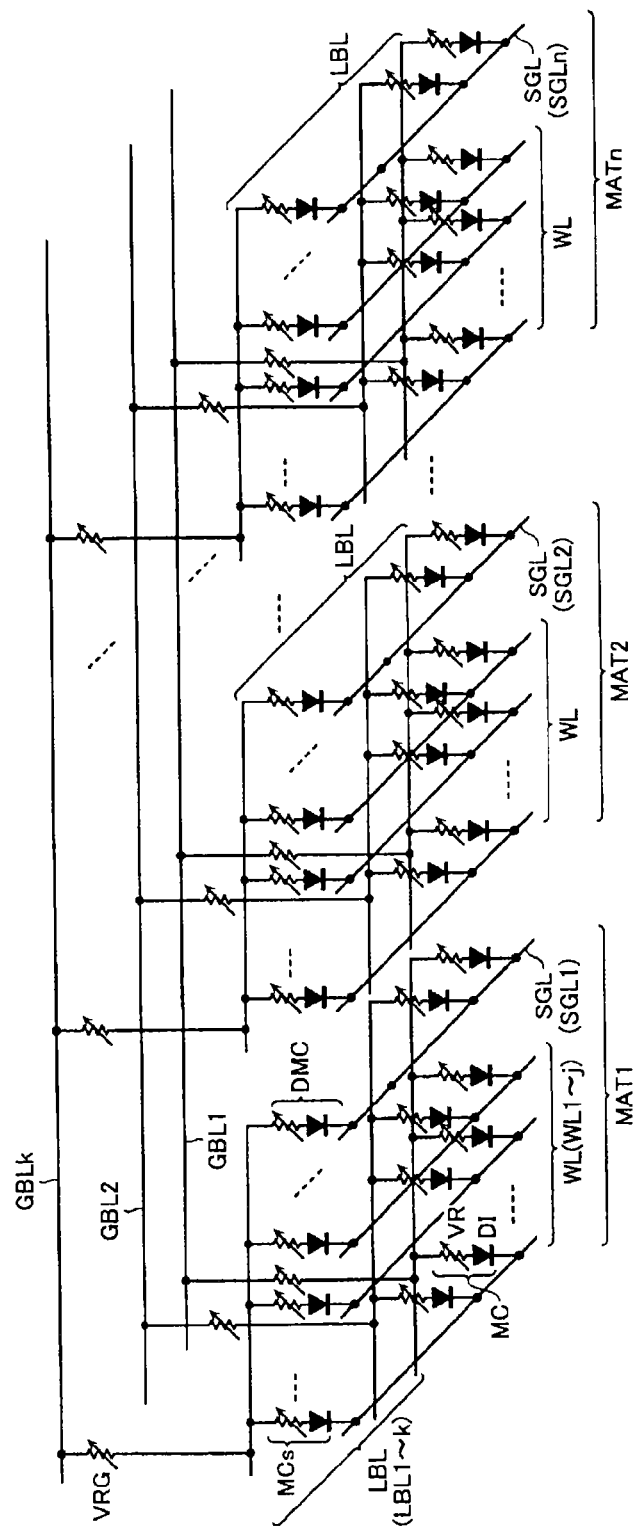
FIG. 4 is an equivalent circuit diagram showing a configuration of the memory cell array 11 in the nonvolatile semiconductor memory device of the first embodiment.

As shown in FIG. 4, each of the memory mats MATi (i=1~n) comprises a plurality of word lines WL (j word lines WL) and a plurality of local bit lines LBL (k local bit lines LBL) and comprises a plurality of memory cells MC (j×k memory cells MC) at intersections of the word lines WL and the local bit lines LBL.

Figure 9:
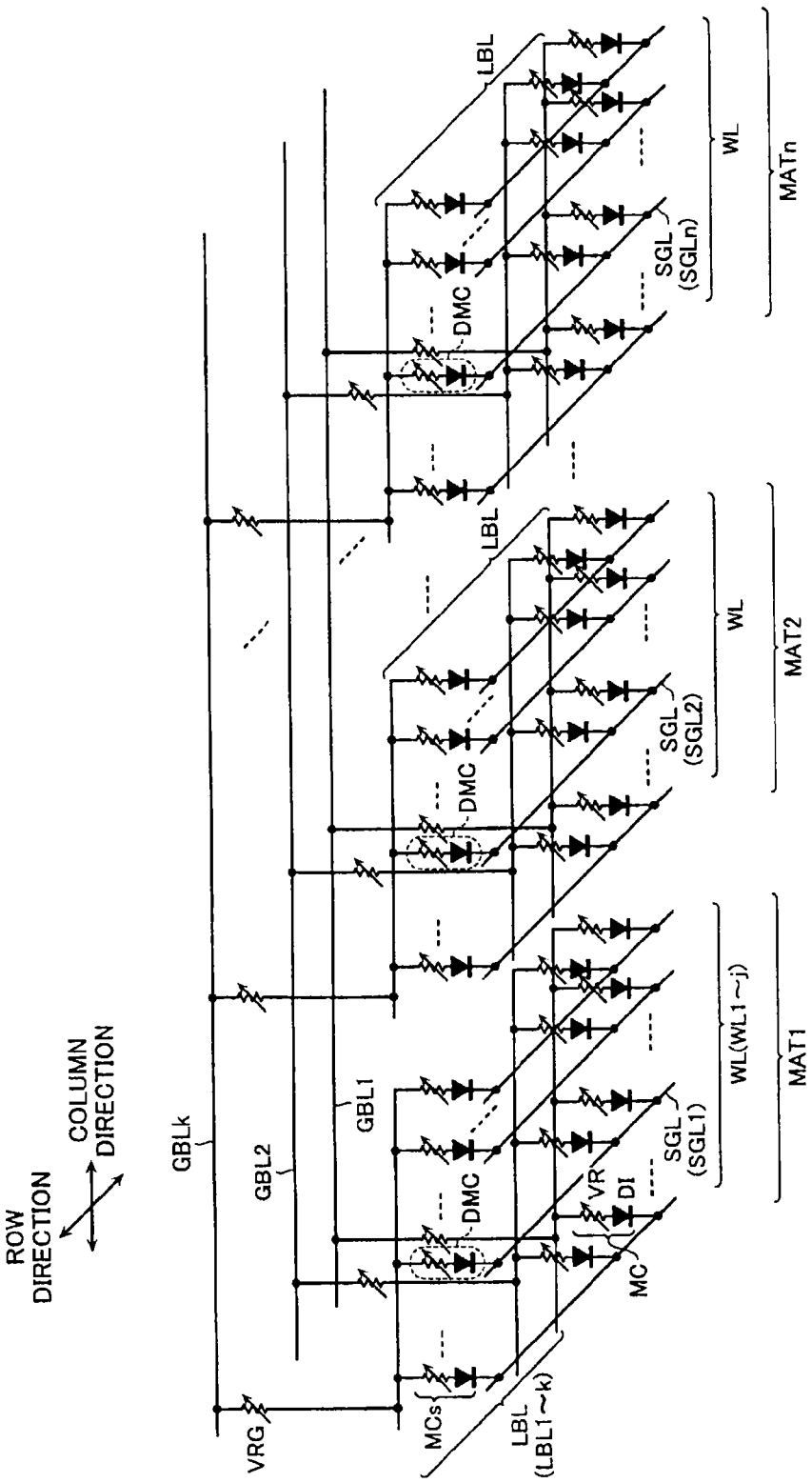
FIG. 9 is an equivalent circuit diagram showing a configuration of the memory cell array 11 in the nonvolatile semiconductor memory device of modification of the first embodiment.

In addition, each of the memory mats MATi comprises a select gate line SGL. This select gate line SGL is formed extending in parallel to the word lines WL and is connected to each of the local bit lines LBL via a dummy cell DMC. The dummy cell DMC may be configured as a stacked body having an identical structure to the memory cell MC, but differs from the memory cell MC in not being employed for storage of data. The select gate line SGL is applied with a first voltage (for example, a ground voltage Vss) when the memory mat MATi corresponding to the select gate line SGL is selected and is applied with a second voltage higher than this first voltage (for example, a power supply voltage Vdd) when the memory mat MATi corresponding to the select gate line SGL is unselected. Note that the dummy cell DMC includes the diode DI similarly to the memory cell MC. The diode DI is connected having a direction from the local bit line LBL to the select gate line SGL as a forward direction. Note that in FIG. 4, the select gate line SGL and the dummy cell DMC are provided at an end of the memory mat MAT. However, as shown in FIG. 9, the select gate line SGL and the dummy cell DMC may also be provided at a central vicinity of the memory mat MAT instead.

The global bit lines GBL are arranged in parallel to (in an identical direction to) the local bit lines LBL and have the column direction as a long direction. The global bit lines GBL are provided in a number corresponding to the number of local bit lines LBL in each of the memory mats MATi. In this embodiment, the number of global bit lines GBL is assumed to be identical to the number k of local bit lines LBL.

The global bit line GBL and the local bit line LBL are connected via a variable resistance element VRG (second variable resistance element). The global bit line GBL is arranged through the n memory mats MAT1~MATn. A single global bit line GBL is connected to each of the plurality of memory mats MAT1~MATn via n variable resistance elements VRG, respectively. The variable resistance element VRG has its resistance value changed from a high-resistance state to a low-resistance state when the memory mat MATi corresponding to the variable resistance element VRG is selected.

Note that the variable resistance element VRG may have a same material as that of the variable resistance element VR in the memory cell MC, and have a same shape as that of the variable resistance element VR. Needless to say, the materials or the shape of the both of the variable resistance elements may be different from each other.

[Operations]

Operations of the resistance varying memory in the first embodiment are now described. As an example, the case is described where the memory mat MAT1 is selected and the memory cell MC positioned at the intersection of the local bit line LBLk (selected local bit line) and the word line WL1 (selected word line) in that memory mat MAT1 is subjected to a write operation.

(Write Preparation Operation)

In this case, the following operation is executed for preparation of the write operation, namely an operation for switching the resistance value of the variable resistance elements VRG linked to the selected memory mat MAT1 from a high-resistance state to a low-resistance state. In this operation, first, all of the global bit lines GBL1~GBLk have their voltage set to a voltage Vprep ("H"). Then, regarding the select gate lines SGL, only the select gate line SGL in the memory mat MATT (SGL1) has its potential set to the ground voltage Vss ("L"), while the select gate lines SGL in the other memory mats MAT2~MATn have their voltage set to the voltage Vprep ("H"). This results in a forward bias voltage being applied only between the global bit lines GBL1~GBLk and the select gate line SGL of the selected memory mat MAT1, and the resistance value of the variable resistance elements VRG connected between those global bit lines GBL1~GBLk and select gate line SGL of the selected memory mat MAT1 changing from a high-resistance state to a low-resistance state. A voltage is not applied between the global bit lines GBL1~GBLk and the unselected memory mats MAT2~MATn, hence the voltage value of the variable resistance elements VRG connected between those global bit lines GBL1~GBLk and unselected memory mats MAT2~MATn does not change.

Note that FIGS. 1-4 described an example where the memory mats MAT are formed in parallel in a single layer on the semiconductor substrate. However, a configuration of the kind where a plurality of layers of the plurality of memory mats MAT are stacked in a direction perpendicular to the semiconductor substrate may also be adopted instead.

(Write Operation)

When the above-described write preparation operation has been completed, then, the procedure shifts to the write operation in the selected memory mat MAT1. Although one example of write operations is shown hereinbelow, a method of applying a voltage, voltage values and so on indicated hereinbelow are merely an example, and various publicly known or similar voltage application methods may also be adopted.

When the memory cell MCs is subjected to the write operation, the global bit line GBLk connected to the selected local bit line LBLk is applied with a setting voltage Vset, and the other global bit lines GBL1~GBLk-1 are applied with the ground voltage Vss. Regarding the word lines WL, only the selected word line WL1 is applied with the ground voltage Vss, while the other unselected word lines WL2~WLj are applied with the setting voltage Vset. When the above-described voltages are applied to the global bit lines GBL, these voltages are applied to the local bit lines LBL via the variable resistance elements VRG that have changed to a low-resistance state. This results in only the selected memory cell MCs being applied with a high voltage for write, whereby the write operation (operation for changing the variable resistance element VR in the selected memory cell MCs from a high-resistance state to a low-resistance state) is executed.

(Write Completion Operation)

When the write operation has been completed, an operation for returning (resetting) the variable resistance elements VRG connected to the selected memory mat MAT1 to a former high-resistance state (write completion operation) is executed. In this write completion operation, first, all of the global bit lines GBL1~GBLk have their voltage set to a voltage Vprep' ("H"). The voltage Vprep' is a voltage which is slightly smaller than the aforementioned voltage Vprep. Then, regarding the select gate lines SGL, only the select gate line SGL in the memory mat MAT1 (SGL1) has its potential set to the ground voltage Vss ("L"), while the select gate lines SGL in the other memory mats MAT2~MATn have their voltage set to the voltage Vprep' ("H").

An application period of the voltage is longer than that in the case of the write preparation operation. This results in a forward bias voltage being applied only between the global bit lines GBL1~GBLk and the select gate line SGL1 of the selected memory mat MAT1, and the resistance value of the variable resistance elements VRG connected between those global bit lines GBL1~GBLk and select gate line SGL1 of the selected memory mat MAT1 changing from a low-resistance state to a high-resistance state. A voltage is not applied between the global bit lines GBL1~GBLk and the unselected memory mats MAT2~MATn, hence the voltage value of the variable resistance elements VRG connected between those global bit lines GBL1~GBLk and unselected memory mats MAT2~MATn does not change. As a result of the above, the write operation is completed. Likewise regarding a read operation, a read preparation operation for preparation of the read operation and a read completion operation for completion of the read operation are executed before and after a publicly known read operation. Applied voltages in the read preparation operation and applied voltages in the read completion operation are similar to applied voltages in the write preparation operation and applied voltages in the write completion operation, respectively.

In the case of the above-described write operation, the setting voltage of the variable resistance element VRG is preferably large with respect to the setting voltage of the variable resistance element VR, and the resetting voltage of the variable resistance element VRG is preferably large with respect to the resetting voltage of the variable resistance element VR.

[Advantages]

In the present embodiment, a nonvolatile semiconductor memory device in which a memory cell array is divided into a plurality of memory mats has a variable resistance element VRG connected between a local bit line LBL and a global bit line GBL. This variable resistance element VRG can be switched between a high-resistance state and a low-resistance state as required, thereby functioning as a switch. Wiring to this variable resistance element itself is not required, hence exclusive area of the variable resistance element is small compared to the case where a switch element such as a transistor is adopted. Therefore, a reduction in circuit area can be achieved.

In a nonvolatile semiconductor memory device having a memory cell array divided into a plurality of memory mats, it is desirable for size of the memory mats to be reduced to suppress disturbance to unselected memory cells. However, reducing the size of the memory mats and increasing the number of memory mats increases a scale of a switching circuit for controlling connect ion between the global bit line and the local bit line. However, in the present embodiment, switching is performed by a variable resistance element between the global bit line and the local bit line as described above, hence an increase in scale of the switching circuit can be suppressed. Therefore, the present embodiment enables scale of the switching circuit and other circuits to be kept small while suppressing disturbance to unselected memory cells.

Second Embodiment

Next, configuration of a nonvolatile semiconductor memory device according to a second embodiment is described with reference to FIGS. 5-6.

An overall configuration of this embodiment is substantially identical to that of the first embodiment (FIG. 1). However, in this embodiment, as shown in FIG. 5, the plurality of memory mats MAT are stacked in plurality in the direction perpendicular to the semiconductor substrate. Moreover, the plurality of memory mats MAT adjacent in an up-down direction share the global bit line GBL at least in part. The global bit line GBL can be arranged through the plurality of memory mats aligned in the direction parallel to the semiconductor substrate, similarly to in the first embodiment.

Figure 5:
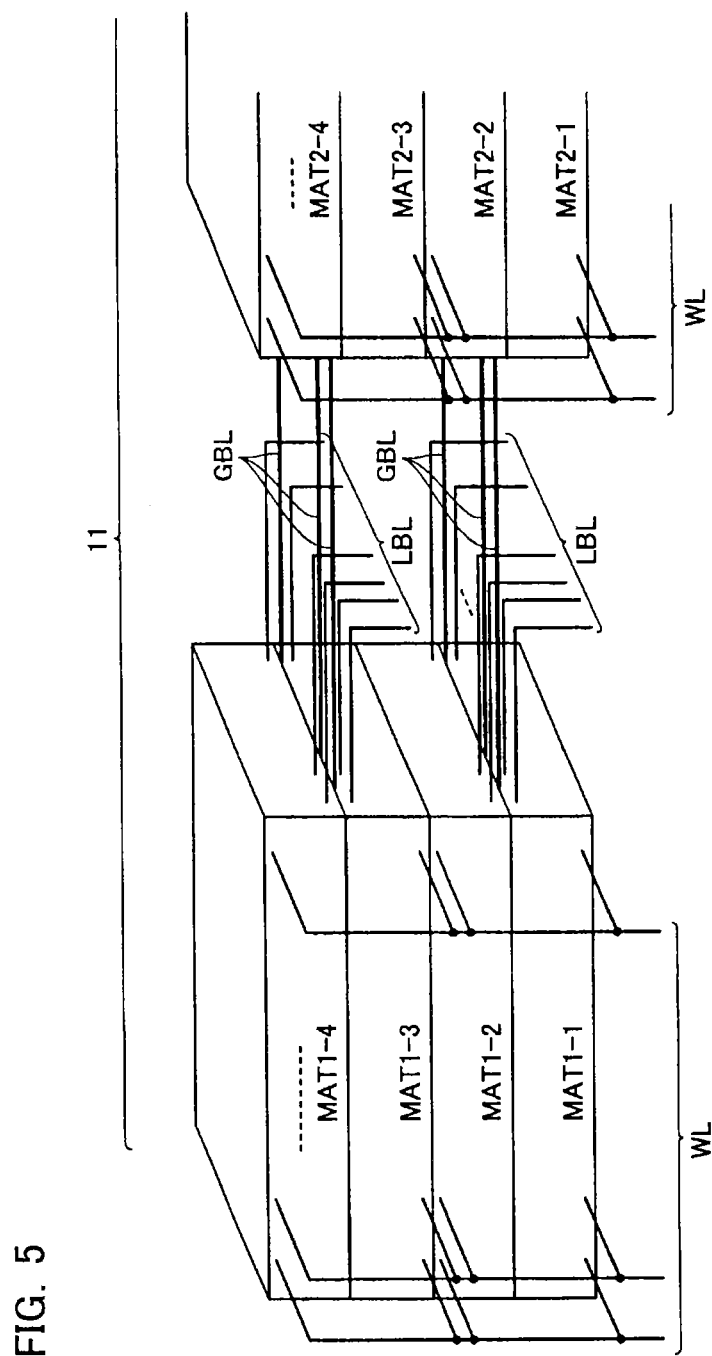
FIG. 5 is a schematic view showing a configuration of a memory cell array 11 in a nonvolatile semiconductor memory device according to a second embodiment.

This FIG. 5 shows an example where four memory mats MATi-1~MATi-4 are stacked, the global bit lines GBL are shared between the memory mat MATi-1 and the memory mat MATi-2, and the global bit lines GBL are shared between the memory mat MATi-3 and the memory mat MATi-4. Note that when a plurality of memory mats are stacked as in FIG. 5, either the word lines WL or the local bit lines LBL may be commonly connected between a plurality of layers. FIG. 5 illustrates an example where the word lines WL are commonly connected to a plurality of layers and the local bit lines LBL are independently connected to each of the plurality of layers, respectively.

Figure 6:
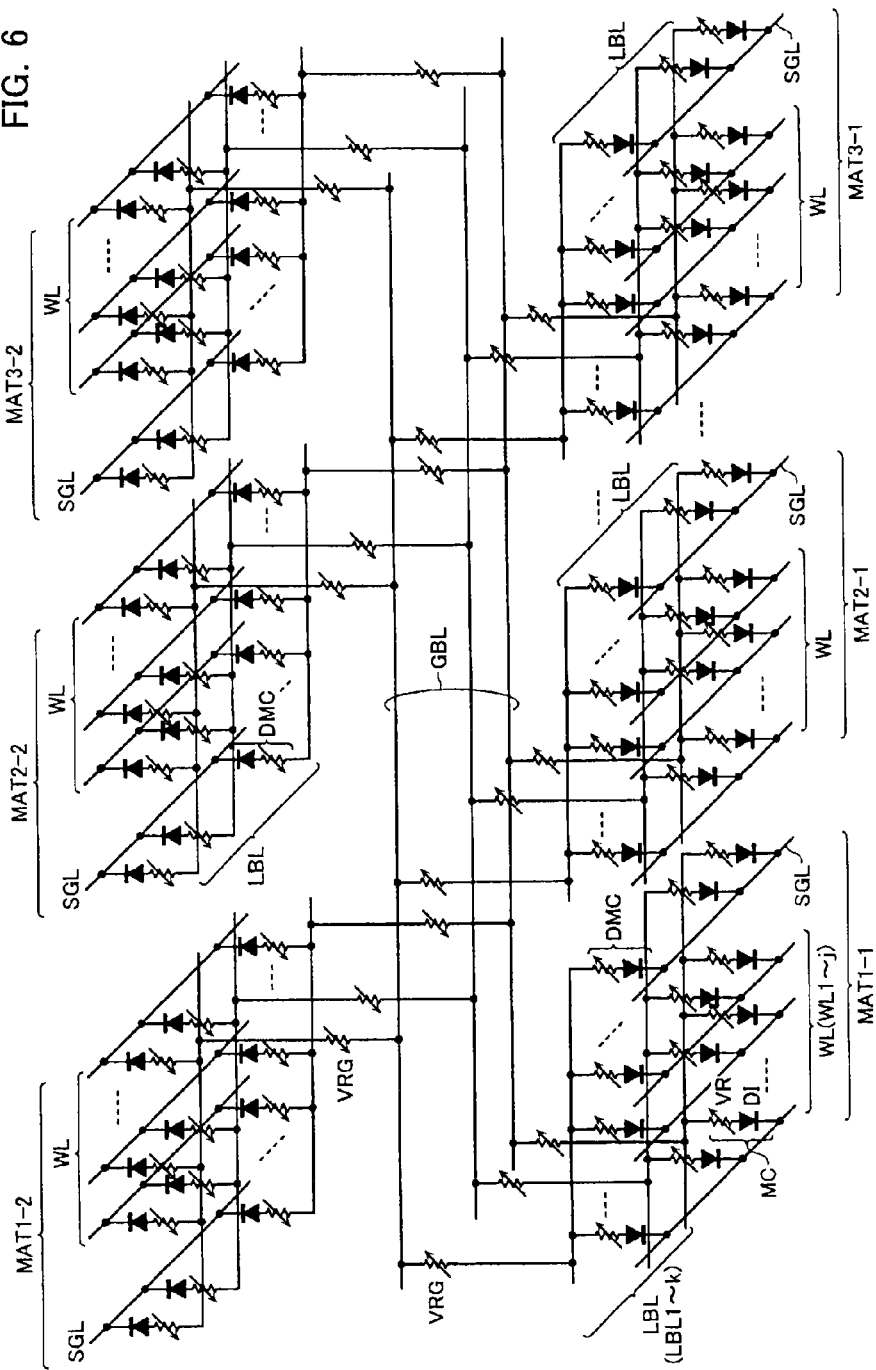
FIG. 6 is an equivalent circuit diagram showing a configuration of the memory cell array 11 in the nonvolatile semiconductor memory device of the second embodiment.

FIG. 6 is an equivalent circuit diagram explaining a specific configuration of the memory mats MATi-1 and MATi-2 adjacent in the stacking direction. A configuration of the memory mats MATi-3 and MATi-4 is similar, hence a description thereof is omitted.

The configuration of each of the memory mats MAT is similar to in the first embodiment. However, the memory mat MATi-1 and the memory mat MATi-2 have a symmetrical structure sandwiching the global bit lines GBL. That is, the memory mat MATi-2 has a structure which is that of the memory mat MATi-1 inverted in the up-down direction. A stacking sequence of the memory cell in the memory mats MAT1-1~MATn-1 and that of the memory mat MAT1-2~MATn-2 are the opposite.

Operations are substantially identical to those in the first embodiment.

[Advantages]

The present embodiment enables identical advantages to those of the first embodiment to be obtained. In addition, by having the global bit lines GBL shared between memory mats adjacent in the stacking direction, the number of wiring layers can be reduced and a further reduction in circuit area compared to in the first embodiment can be achieved.

Third Embodiment

Figure 7:
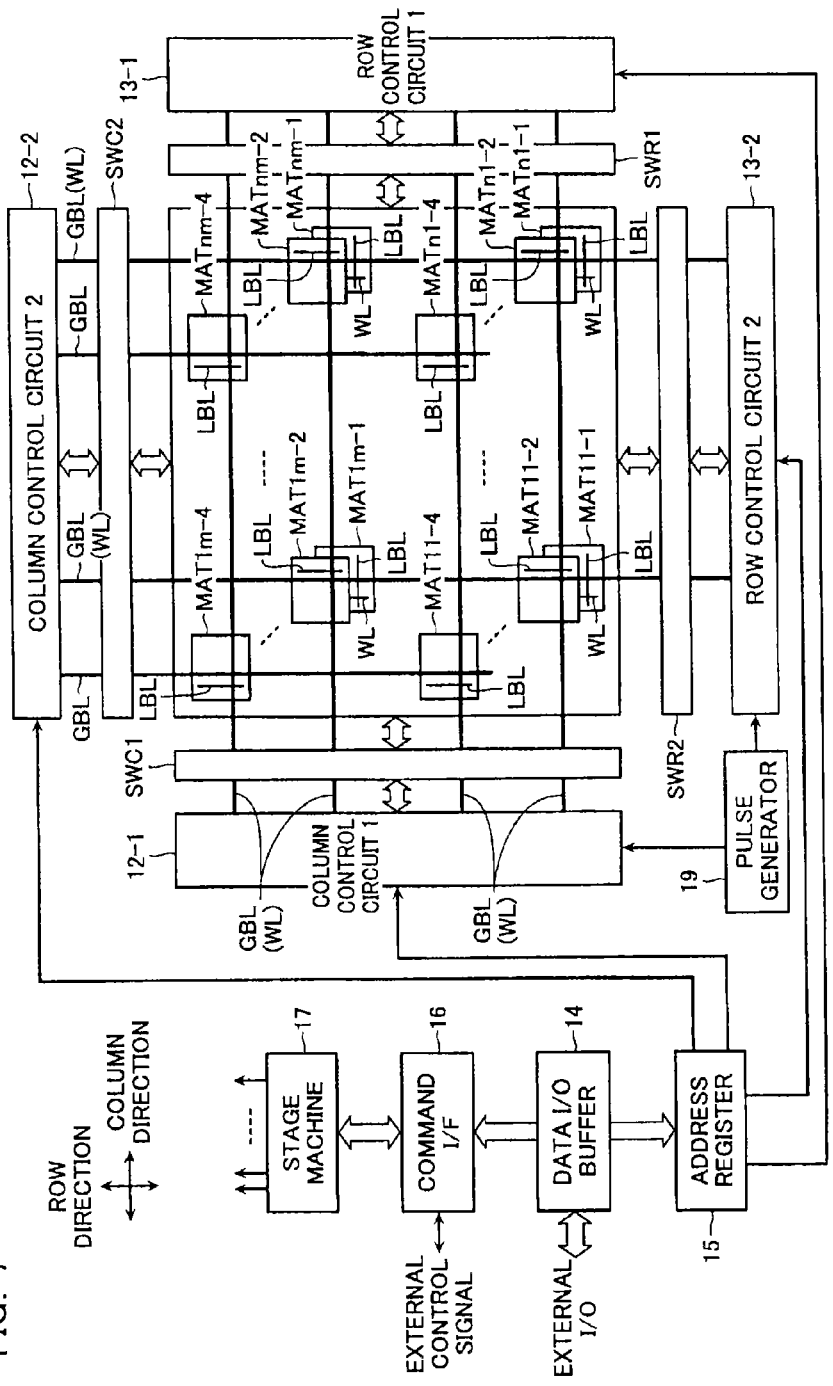
FIG. 7 is a block diagram showing an overall configuration of a nonvolatile semiconductor memory device according to a third embodiment.
Figure 8:
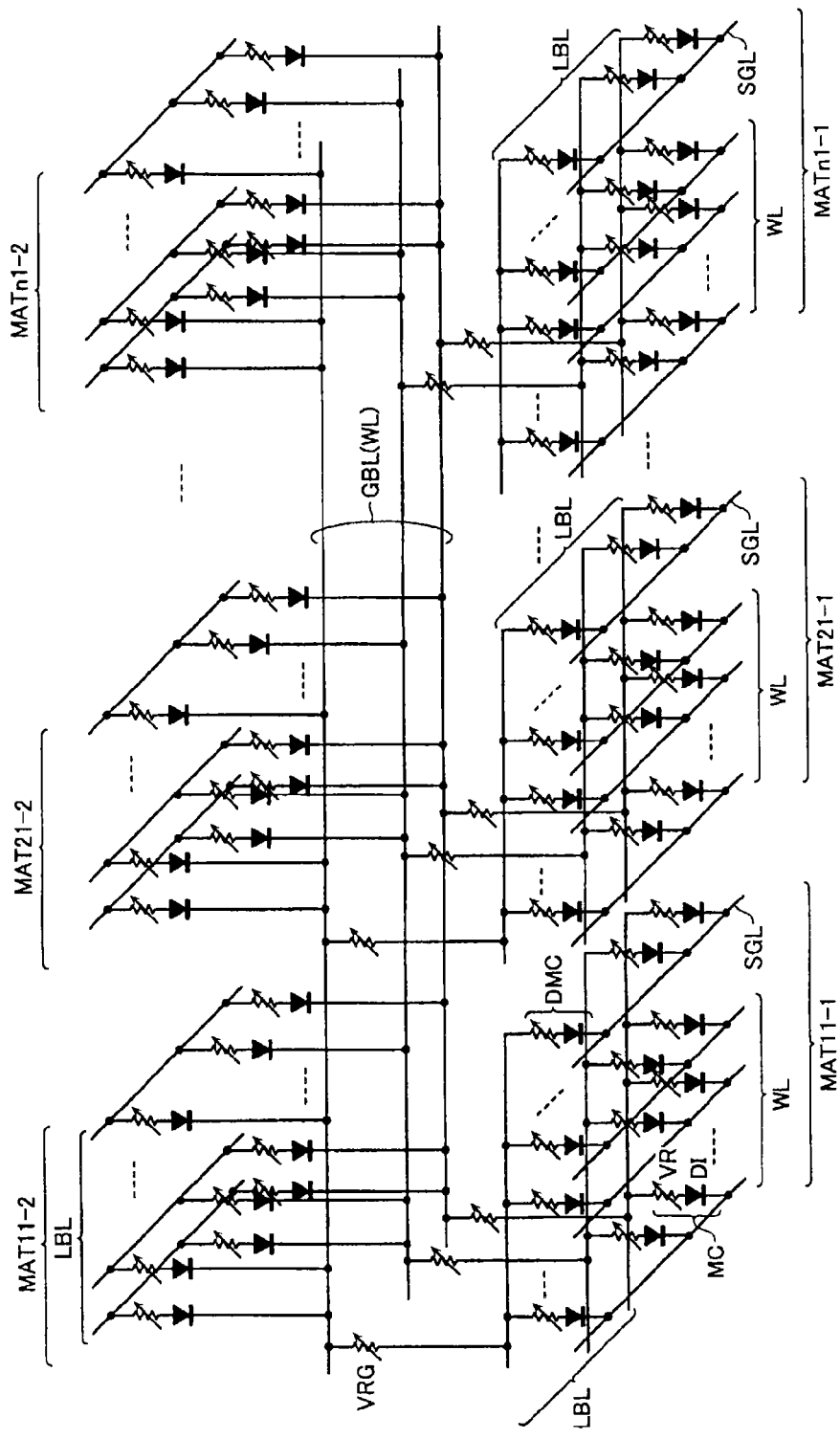
FIG. 8 is an equivalent circuit diagram showing a configuration of a memory cell array 11 in the nonvolatile semiconductor memory device of the third embodiment.

Next, a configuration of a nonvolatile semiconductor memory device according to a third embodiment is described with reference to FIGS. 7~8. FIG. 7 is a block diagram showing an overall configuration of the third embodiment, and FIG. 8 shows a configuration of the memory cell array 11.

This third embodiment is identical to the second embodiment in having the plurality of memory mats MAT stacked in plurality in the direction perpendicular to the semiconductor substrate. Moreover, the third embodiment is identical to the second embodiment also in having the plurality of memory mats MAT adjacent in an up-down direction sharing the global bit line GBL at least in part. However, this third embodiment differs from the second embodiment in that it has shared global bit lines GBL that also serve as the word lines WL.

As shown in FIG. 7, this embodiment has, for example, four layers of memory mats MATxy-1~MATxy-4 (x=1~n, y=1~m) stacked on the semiconductor substrate, and groups of those four memory mats MATxy-1~MATxy-4 disposed in an n×m arrangement. That is, this memory cell array 11 has 4×m×n memory mats MAT arranged in a matrix in the directions parallel to and perpendicular to the semiconductor substrate.

Moreover, in at least a portion of the memory mats MATxy-1~MATxy-4 thus stacked, the global bit lines GBL serve also as the word lines WL. In the description below, a global bit line GBL that also functions as a word line WL is notated as "global bit line GBL(WL)". On the other hand, a global bit line GBL functioning only as a global bit line GBL and not functioning as a word line WL is notated simply as "global bit line GBL". Note that the present embodiment illustrates the case where the global bit line GBL connected to the memory mat MATxy-4 in an uppermost layer functions only as a global bit line GBL without functioning as a word line WL. However, the present embodiment is not limited to this case.

As described above, the global bit lines GBL(WL) in the present embodiment function also as the word lines WL. Therefore, as shown in FIG. 7, the nonvolatile semiconductor memory device in the present embodiment comprises two column control circuits 12-1 and 12-2, and comprises two row control circuits 13-1 and 13-2.

The column control circuit 12-1 is disposed adjacently to the memory cell array 11 in the column direction, while the column control circuit 12-2 is disposed adjacently to the memory cell array 11 in the row direction. The column control circuit 12-1 is connected to the global bit lines GBL(WL) extending having the column direction as a long direction in the memory cell array 11. On the other hand, the column control circuit 12-2 is connected to the global bit lines GBL (WL) extending having the row direction as a long direction in the memory cell array 11.

The row control circuit 13-1 is disposed adjacently to the memory cell array 11 in the column direction, while the row control circuit 13-2 is disposed adjacently to the memory cell array 11 in the row direction.

The row control circuit 13-1 is connected to the global bit lines GBL(WL) extending having the column direction as a long direction in the memory cell array 11. On the other hand, the row control circuit 13-2 is connected to the global bit lines GBL(WL) extending having the row direction as a long direction in the memory cell array 11. In the case that the global bit line GBL(WL) is caused to function as the word line WL, both the row control circuits 13-1 and 13-2 select the global bit line GBL(WL) and supply the global bit line GBL(WL) with a voltage required in an operation.

In FIG. 7, normally, the column control circuit 12-2 and row control circuit 13-1 operate as a pair, and the column control circuit 12-1 and row control circuit 13-2 operate as a pair. For example, when the column control circuit 12-2 and row control circuit 13-1 operate, a column side switch transistor SWC1 and a row side switch transistor SWR2 block a current, whereby the column control circuit 12-1 and row control circuit 13-2 are not driven.

FIG. 8 is an equivalent circuit diagram describing a specific configuration of the memory mats MATxy-1 and MATxy-2 adjacent in the stacking direction. FIG. 8 typically illustrates groups of n memory mats MAT aligned in the column direction.

A configuration of the memory mats MAT11-1~MATn1-1 in a lowermost layer is similar to that of the second embodiment (FIG. 6). A configuration of the memory mats MAT11-2~MATn1-2 in a second layer differs from that of the second embodiment in that it has the global bit lines GBL(WL) that also functions as the word lines WL. That is, the memory mats MAT1-2~MAT3-2 in a second layer of the second embodiment each comprise the local bit lines LBL and the word lines WL, but the memory mats MAT11-2~MATn1-2 in the second layer of the present embodiment do not include the word lines WL and have the global bit lines GBL(WL) serving also as the word lines WL. Therefore, the number of wiring lines can be reduced and a reduction in manufacturing costs can be achieved compared to in the second embodiment.

Note that although not illustrated in FIG. 8, the global bit lines GBL are connected also to a layer above the second layer of memory mats MAT11-2~MATn1-2 via the variable resistance element VRG.

In addition, a stacking sequence of the memory cell in the memory mats MAT11-1~MAT11-$n$-1 and that of the memory mat MAT11-2~MATn1-2 are the same. While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array configured having a plurality of memory mats arranged therein, each of the memory mats having a memory cell disposed therein at an intersection of a first line and a second line, the memory cell including a first variable resistance element;
   a third line extending through a plurality of the memory mats; and
   a second variable resistance element connected between the third line and the second line of each of the plurality of memory mats,
   prior to a write operation to a selected memory cell, the second variable resistance element connected to the memory mat including the selected memory cell being changed from a high resistance state to a low resistance state, and
   after the write operation to the selected memory cell, the second variable resistance element connected to the memory mat including the selected memory cell being changed from a low resistance state to a high resistance state.

2. The nonvolatile semiconductor memory device according to claim 1, wherein
   a plurality of the memory mats are stacked in a perpendicular direction perpendicular to a semiconductor substrate, and
   the third line in a first memory mat is shared as the second line in a second memory mat positioned in a layer above the first memory mat.

3. The nonvolatile semiconductor memory device according to claim 1, wherein
   a setting voltage for the second variable resistance element is larger than that for the first variable resistance element.

4. The nonvolatile semiconductor memory device according to claim 1, wherein
   a resetting voltage for the second variable resistance element is larger than that for the first variable resistance element.

5. The nonvolatile semiconductor memory device according to claim 1, wherein
   the memory cell includes a first diode serially-connected to the first variable resistance element.

6. The nonvolatile semiconductor memory device according to claim 5, wherein
   the first diode is connected having a direction from the second line to the first line as a forward direction.

7. The nonvolatile semiconductor memory device according to claim 1, wherein the first variable resistance element and the second variable resistance element are different with respect to a material thereof or a shape thereof.

8. The nonvolatile semiconductor memory device according to claim 2, wherein
the third line has one end connected to a column control circuit via a first switch transistor, and has another end connected to a row control circuit via a second switch transistor.

9. The nonvolatile semiconductor memory device according to claim 2, wherein
the memory cell has a stacked structure, a stacking sequence of the memory cell in the first memory mat and that of the second memory mat being the same.

10. A nonvolatile semiconductor memory device, comprising:
a memory cell array configured having a plurality of memory mats arranged therein, each of the memory mats having a memory cell disposed therein at an intersection of a first line and a second line, the memory cell including a first variable resistance element;
a third line extending through a plurality of the memory mats; and
a second variable resistance element connected between the third line and the second line of each of the plurality of memory mats,
prior to a read operation to a selected memory cell, the second variable resistance element connected to the memory mat including the selected memory cell is changed from a high resistance state to a low resistance state, and
after the read operation to the selected memory cell, the second variable resistance element connected to the memory mat including the selected memory cell is changed from a low resistance state to a high resistance state.

11. The nonvolatile semiconductor memory device according to claim 10, wherein
a plurality of the memory mats are stacked in a perpendicular direction perpendicular to a semiconductor substrate, and
the third line in a first memory mat is shared as the second line in a second memory mat positioned in a layer above the first memory mat.

12. The nonvolatile semiconductor memory device according to claim 10, wherein
a setting voltage for the second variable resistance element is larger than that for the first variable resistance element.

13. The nonvolatile semiconductor memory device according to claim 10, wherein
a resetting voltage for the second variable resistance element is larger than that for the first variable resistance element.

14. The nonvolatile semiconductor memory device according to claim 10, wherein
the memory cell includes a first diode serially-connected to the first variable resistance element.

15. The nonvolatile semiconductor memory device according to claim 14, wherein
the first diode is connected having a direction from the second line to the first line as a forward direction.

16. The nonvolatile semiconductor memory device according to claim 10, wherein
the first variable resistance element and the second variable resistance element are different with respect to a material thereof or a shape thereof.

17. The nonvolatile semiconductor memory device according to claim 11, wherein
the third line has one end connected to a column control circuit via a first switch transistor, and has another end connected to a row control circuit via a second switch transistor.

18. The nonvolatile semiconductor memory device according to claim 11, wherein
the memory cell has a stacked structure, a stacking sequence of the memory cell in the first memory mat and that of the second memory mat being the same.

* * * * *